US012603130B2

(12) United States Patent
Guo et al.

(10) Patent No.: US 12,603,130 B2
(45) Date of Patent: Apr. 14, 2026

(54) MEMORY AND READING, WRITING AND ERASING METHODS THEREOF

(71) Applicant: SHANGHAI IC R&D CENTER CO., LTD., Shanghai (CN)

(72) Inventors: Lingyi Guo, Shanghai (CN); Xueru Yu, Shanghai (CN)

(73) Assignee: SHANGHAI IC R&D CENTER CO., LTD., Shanghai (CN)

( * ) Notice: Subject to any disclaimer, the term of this patent is extended or adjusted under 35 U.S.C. 154(b) by 186 days.

(21) Appl. No.: 18/690,274

(22) PCT Filed: Dec. 31, 2021

(86) PCT No.: PCT/CN2021/143848
§ 371 (c)(1),
(2) Date: Mar. 8, 2024

(87) PCT Pub. No.: WO2023/035512
PCT Pub. Date: Mar. 12, 2023

(65) Prior Publication Data
US 2024/0379158 A1      Nov. 14, 2024

(30) Foreign Application Priority Data
Sep. 8, 2021    (CN) .......................... 202111048164.8

(51) Int. Cl.
*G11C 13/00* (2006.01)

(52) U.S. Cl.
CPC ........ *G11C 13/004* (2013.01); *G11C 13/0026* (2013.01); *G11C 13/0028* (2013.01); *G11C 13/0069* (2013.01)

(58) Field of Classification Search
CPC .............. G11C 13/004; G11C 13/0026; G11C 13/0028; G11C 13/0069; G11C 13/0007;
(Continued)

(56) References Cited

U.S. PATENT DOCUMENTS 9,514,818 B1    12/2016  Roizin et al.
10,861,544 B2 *  12/2020  Haukness ................ G11C 7/08
(Continued)

FOREIGN PATENT DOCUMENTS

CN           1503366       6/2004
CN          101123120      2/2008
(Continued)

OTHER PUBLICATIONS

"International Search Report (Form PCT/ISA/210) of PCT/CN2021/143848," mailed on May 30, 2022, with English translation thereof, pp. 1-7.
(Continued)

*Primary Examiner* — Khamdan N. Alrobaie
(74) *Attorney, Agent, or Firm* — JCIPRNET

(57) ABSTRACT

A memory and reading, writing and erasing methods thereof. The memory includes: H memory planes arranged in parallel along a first direction, where each memory plane extends in a second direction, and includes M columns of memory strings; each column of memory string extends in a third direction; the first direction, the second direction and the third direction are all different, and H and M are integers greater than zero; each column of memory string includes N rows of memristive memory cells. The memory is also provided with word lines, gating transistors, gating lines, bit lines and a common source line, where memristive memory cells in last rows of all memory strings are connected to the common source line, and the common source line is connected to a reference potential through a reference resistor. Use performance of the memory can be improved.

17 Claims, 6 Drawing Sheets

(58) Field of Classification Search

CPC ... G11C 13/003; G11C 16/0483; G11C 16/08; G11C 16/26; G11C 13/0009

See application file for complete search history.

(56) References Cited

U.S. PATENT DOCUMENTS

| | | | |
|---|---|---|---|
| 2006/0250854 A1* | 11/2006 | Lee | G11C 16/14 |
| | | | 365/185.25 |
| 2010/0034019 A1* | 2/2010 | Kang | G11C 16/3454 |
| | | | 365/185.25 |
| 2010/0046273 A1* | 2/2010 | Azuma | G11C 13/0023 |
| | | | 257/E47.001 |
| 2010/0124095 A1 | 5/2010 | Jung et al. | |
| 2019/0267106 A1* | 8/2019 | Date | H10B 41/40 |
| 2020/0381032 A1 | 12/2020 | Koike et al. | |
| 2021/0019609 A1 | 1/2021 | Strukov et al. | |

FOREIGN PATENT DOCUMENTS

| | | |
|---|---|---|
| CN | 101872647 | 10/2010 |
| CN | 104978996 | 10/2015 |
| CN | 110797063 | 2/2020 |
| CN | 111192614 | 5/2020 |
| CN | 113096709 | 7/2021 |
| CN | 113707200 | 11/2021 |
| JP | 2008065953 | 3/2008 |

OTHER PUBLICATIONS

"Written Opinion of the International Searching Authority (Form PCT/ISA/237) of PCT/CN2021/143848," mailed on May 30, 2022, with English translation thereof, pp. 1-8.

Office Action of China Counterpart Application, with English translation thereof, issued on Jun. 22, 2023, pp. 1-12.

"Notice of Grant of China Counterpart Application," with English translation thereof, iissued on Jan. 6, 2024, pp. 1-3.

* cited by examiner

110

120

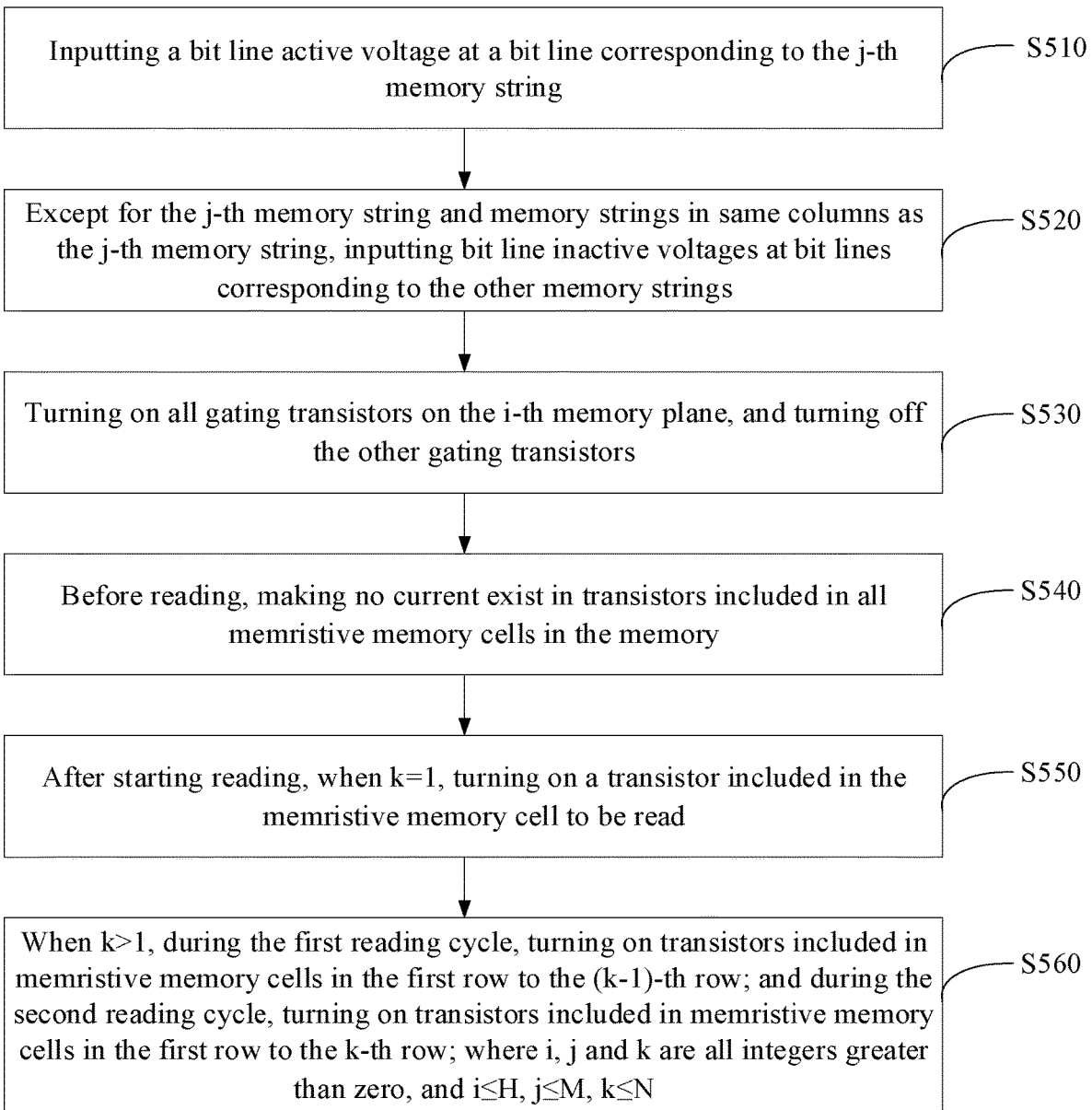

Inputting a bit line active voltage at a bit line corresponding to the j-th memory string — S510

Except for the j-th memory string and memory strings in same columns as the j-th memory string, inputting bit line inactive voltages at bit lines corresponding to the other memory strings — S520

Turning on all gating transistors on the i-th memory plane, and turning off the other gating transistors — S530

Before reading, making no current exist in transistors included in all memristive memory cells in the memory — S540

After starting reading, when k=1, turning on a transistor included in the memristive memory cell to be read — S550

When k>1, during the first reading cycle, turning on transistors included in memristive memory cells in the first row to the (k-1)-th row; and during the second reading cycle, turning on transistors included in memristive memory cells in the first row to the k-th row; where i, j and k are all integers greater than zero, and i≤H, j≤M, k≤N — S560

FIG. 5

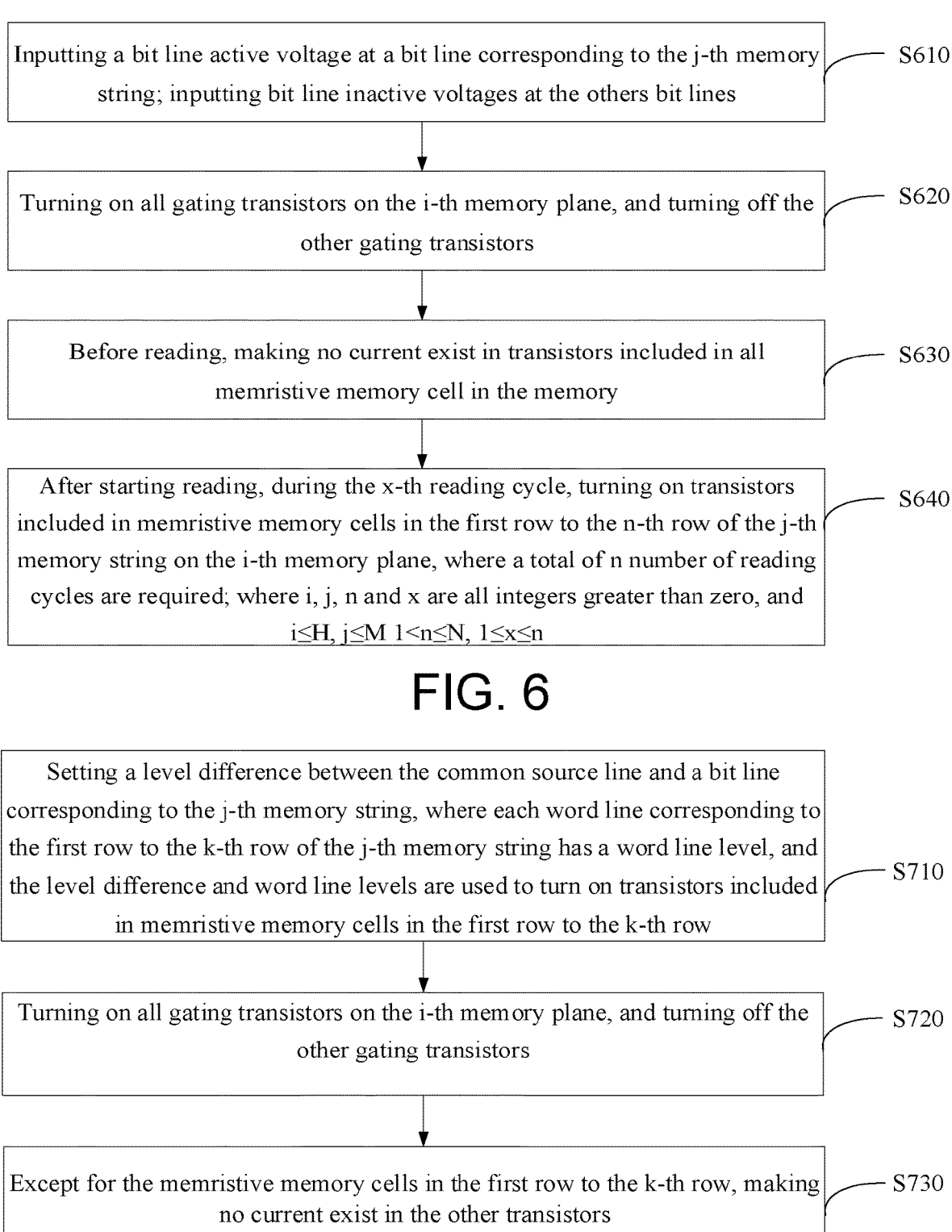

Inputting a bit line active voltage at a bit line corresponding to the j-th memory string; inputting bit line inactive voltages at the others bit lines — S610

Turning on all gating transistors on the i-th memory plane, and turning off the other gating transistors — S620

Before reading, making no current exist in transistors included in all memristive memory cell in the memory — S630

After starting reading, during the x-th reading cycle, turning on transistors included in memristive memory cells in the first row to the n-th row of the j-th memory string on the i-th memory plane, where a total of n number of reading cycles are required; where i, j, n and x are all integers greater than zero, and $i \leq H$, $j \leq M$ $1 < n \leq N$, $1 \leq x \leq n$ — S640

FIG. 6

Setting a level difference between the common source line and a bit line corresponding to the j-th memory string, where each word line corresponding to the first row to the k-th row of the j-th memory string has a word line level, and the level difference and word line levels are used to turn on transistors included in memristive memory cells in the first row to the k-th row — S710

Turning on all gating transistors on the i-th memory plane, and turning off the other gating transistors — S720

Except for the memristive memory cells in the first row to the k-th row, making no current exist in the other transistors — S730

FIG. 7

MEMORY AND READING, WRITING AND ERASING METHODS THEREOF

CROSS-REFERENCE TO RELATED APPLICATIONS

This application is a National Stage of International Application No. PCT/CN2021/143848, filed on Dec. 31, 2021, which claims the priority of the Chinese Patent Application No. 202111048164.8 filed on Sep. 8, 2021. Both of the above applications are incorporated by reference in their entireties.

TECHNICAL FIELD

The present application relates to integrated circuit technologies and, in particular, to a memory and reading, writing and erasing methods thereof.

RELATED ART

Memristors, are a kind of resistors with memory functions and are important components for building memories. A transistor and a resistor are connected in series to form a 1T1R memory cell, and a plurality of 1T1R memory cells form a two-dimensional array so as to form a memory with a certain storage capacity.

However, the storage capacity of an existing memory cannot meet requirements. Therefore, how to increase the storage capacity of the memory has become an urgent problem to be solved.

SUMMARY OF INVENTION

The present application provides a memory and reading, writing and erasing methods thereof, which are used to increase a storage capacity of the memory.

In one aspect, the present application provides a memory, including: H memory planes arranged in parallel along a first direction, where each memory plane extends in a second direction, and the memory plane includes M columns of memory strings, the memory strings extending in a third direction, where the first direction, the second direction and the third direction are all different, and H and M are integers greater than zero, and where a single column of memory string includes (i.e., a single memory string) N rows of memristive memory cells connected in sequence, N being an integer greater than zero; N word lines, where a single word line is connected to corresponding rows of memristive memory cells, the word lines are used to receive word line voltages, and memristive memory cells in same rows receive a same word line voltage; gating transistors, where sources of the gating transistors are connected to memristive memory cells in first rows; gating lines, connected to gates of the gating transistors for receiving gating voltages, where all gating transistors on a memory plane receive a same gating voltage; bit lines, connected to drains of the gating transistors for receiving bit line voltages, where gating transistors in same columns receive a same bit line voltage; a common source line, where memristive memory cells in last rows of all memory strings are connected to the common source line, and the common source line is connected to a reference potential through a reference resistor.

In another aspect, the present application provides a memory reading method, applied to the memory according to the first aspect. When a memristive memory cell to be read is located in a k-th row of a j-th memory string on an i-th memory plane, the method includes: inputting a bit line active voltage at a bit line corresponding to the j-th memory string; except for the j-th memory string and memory strings in same columns as the j-th memory string, inputting bit line inactive voltages at bit lines corresponding to the other memory strings; turning on all gating transistors on the i-th memory plane, and turning off the other gating transistors; before reading, making no current exist in transistors included in all memristive memory cells in the memory; after starting reading, when k=1, turning on a transistor included in the memristive memory cell to be read; after starting reading, when k>1, during a first reading cycle, turning on transistors included in memristive memory cells in a first row to a (k−1)-th row of the j-th memory string on the i-th memory plane; and during a second reading cycle, turning on transistors included in memristive memory cells in the first row to the k-th row of the j-th memory string on the i-th memory plane; where i, j and k are all integers greater than zero, and i≤H, j≤M and k≤N.

In another aspect, the present application provides a memory reading method, applied to the memory according to the first aspect. When memristive memory cells to be read are located in a first row to an n-th row of a j-th memory string on an i-th memory plane, the method includes: inputting a bit line active voltage at a bit line corresponding to the j-th memory string; inputting bit line inactive voltages at the other bit lines; turning on all gating transistors on the i-th memory plane, and turning off the other gating transistors; before reading, making no current exist in transistors included in all memristive memory cells in the memory; after starting reading, during an x-th reading cycle, turning on transistors included in memristive memory cells in the first row to an x-th row of the j-th memory string on the i-th memory plane, where a total of n reading cycles are required (n is the number of reading cycles); where i, j, n and x are all integers greater than zero, and i≤H, j≤M, 1<n≤N, 1≤x≤n.

In another aspect, the present application provides a memory writing method, applied to the memory according to the first aspect. A target resistance value is to be written to a memristive memory cell to be written, and when the memristive memory cell to be written is located in a k-th row of a j-th memory string on an i-th memory plane, the method includes: determining a level difference according to the target resistance value; setting the level difference between the common source line and a bit line corresponding to the j-th memory string, where each word line corresponding to a first row to the k-th row of the j-th memory string has a word line level, and the level difference and word line levels are used to turn on transistors included in memristive memory cells in the first row to the k-th row; turning on all gating transistors on the i-th memory plane, and turning off the other gating transistors; where except for the memristive memory cells in the first row to the k-th row, no current exists in transistors included in the other memristive memory cells; where i, j and k are integers greater than zero, and i≤H, j≤M, k≤N.

In another aspect, the present application provides a memory erasing method, applied to the memory according to the first aspect. When a memory string to be erased is a j-th memory string on an i-th memory plane, the method includes: setting a level difference between the common source line and a bit line corresponding to the j-th memory string, where each word line corresponding to the j-th memory string has a word line level, and the level difference and respective word line levels are used to turn on all transistors included in memristive memory cells of the j-th memory string; turning on all gating transistors on the i-th memory plane; turning off the other gating transistors; where except for the j-th memory string, no current exists in transistors of other memory strings.

The present application provides a memory with a three-dimensional structure. Compared with a two-dimensional planar memory in the prior art, the number of memristive memory cells is increased through a reasonable arrangement of the memristive memory cells, thereby increasing the storage capacity of the memory, improving the use performance of the memory, and enhancing the utilization rate of the memory.

BRIEF DESCRIPTION OF DRAWINGS

FIG. 5 illustrates a memory reading method provided by an embodiment of the present application.

FIG. 6 illustrates a memory reading method provided by an embodiment of the present application.

FIG. 7 illustrates a memory writing method provided by an embodiment of the present application.

EXPLANATION OF REFERENCE SIGNS

Figure 1:
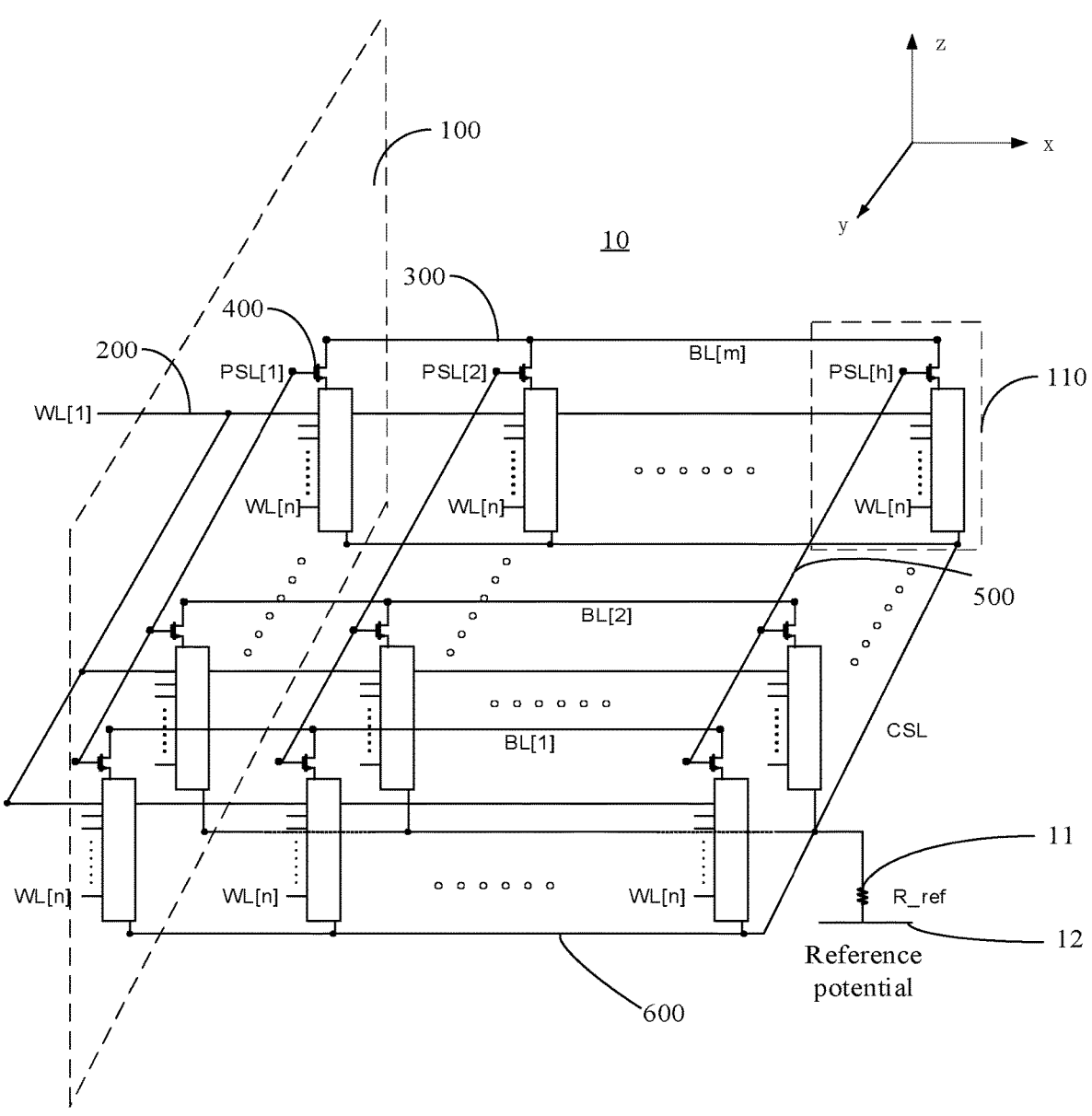
FIG. 1 is a schematic diagram of a memory provided by an embodiment of the present application.

Memory 10
Memory plane 100
Memory string 110
Memristive memory cell 120
Transistor 121
Memristor 122
Word line 200
Bit line 300
Gating transistor 400
Gating line 500
Common source line (CSL) 600
Reference resistor 11
Reference potential 12

DESCRIPTION OF EMBODIMENTS

Exemplary embodiments will be described herein in detail, examples of which are illustrated in the accompanying drawings. When the following description refers to the drawings, unless otherwise indicated, the same numerals corresponding to different drawings indicate the same or similar elements. The present application provides a memory and reading, writing and erasing methods thereof. The memory includes a plurality of memory planes arranged in parallel in a first direction, and each memory plane extends in a second direction and is provided with a plurality of columns of memory strings extending in a third direction. The first direction, the second direction and the third direction are all different. Each memory string is coupled to a corresponding bit line, corresponding word lines and a corresponding gating transistor, where the plurality of columns of memory strings can be connected to a reference potential after being connected to a reference resistor through a common source line, thus the memory transforms from a two-dimensional structure to a three-dimensional structure.

Figure 2:
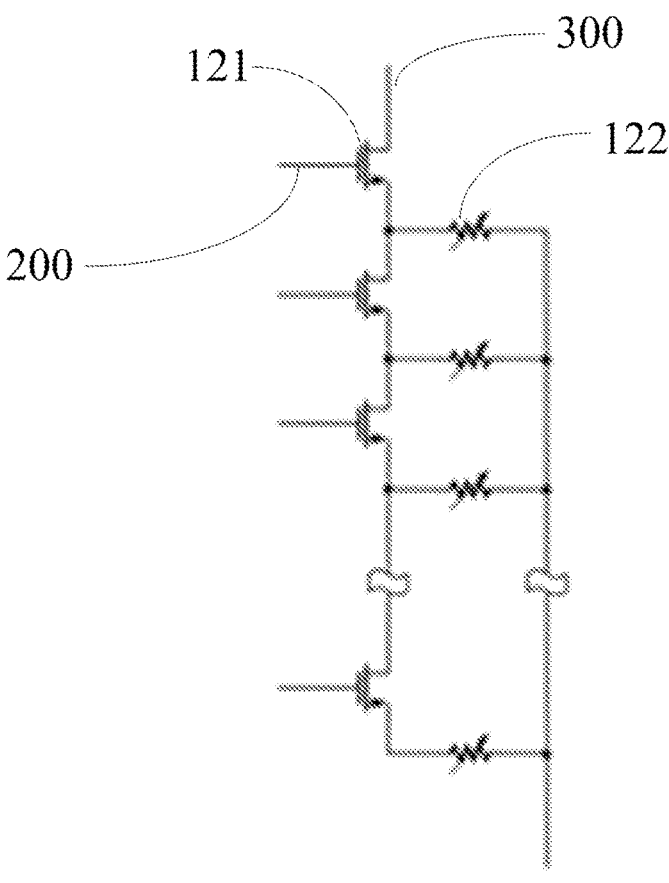
FIG. 2 is a schematic diagram of a memory string provided by an embodiment of the present application.

Referring to FIG. 1 and FIG. 2, an embodiment of the present application provides a memory 10. The memory 10 includes H memory planes 100, N word lines 200, M bit lines 300, H×M gating transistors 400, H gating lines 500, a common source line 600, a reference resistor 11 and a reference potential 12. Each memory plane 100 includes M columns of memory strings 110. Each memory string 110 includes N rows of memristive memory cells 120. H, M and N are all integers greater than zero.

The memory 10 includes H memory planes 100. The memory planes 100 are arranged side by side and spaced apart along a first direction. The memory plane 100 extends along a second direction, and includes M columns of memory strings 110, where the memory string 110 extends in a third direction. As shown in FIG. 1, the first direction, the second direction and the third direction may be a corresponding x-axis direction, y-axis direction and z-axis direction. A single column of memory string 110 includes N rows of memristive memory cells 120 connected in sequence along the third direction, and a single word line 200 is connected to corresponding rows of memristive memory cells 120.

Figure 3:
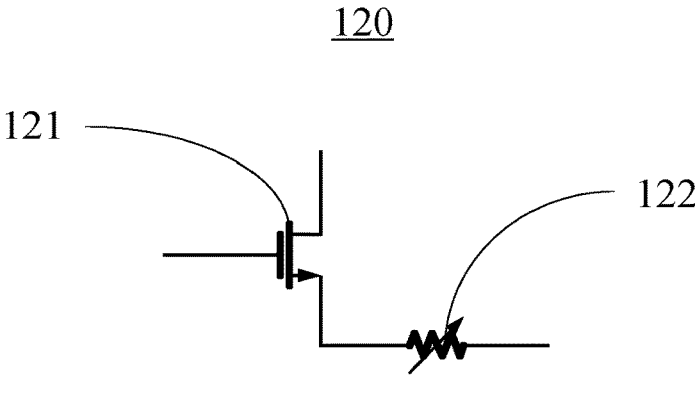
FIG. 3 is a schematic diagram illustrating a connection between a memristive memory cell and a word line provided by an embodiment of the present application.

FIG. 2 is a schematic diagram of a single column of memory string 110, and FIG. 3 is a schematic diagram of a single row of memristive memory cell 120.

As shown in FIG. 2 and FIG. 3, a single memristive memory cell 120 includes a transistor 121 and a memristor 122 that are coupled. A first end of the memristor 122 is connected to the source of the transistor 121, and a second end is connected to a second end of an adjacent memristor 122 in the same column. The drain of the transistor 121 is connected to the source of an adjacent transistor 121 in the same column, and the gate of the transistor 121 is connected to a word line 200.

Figure 4:
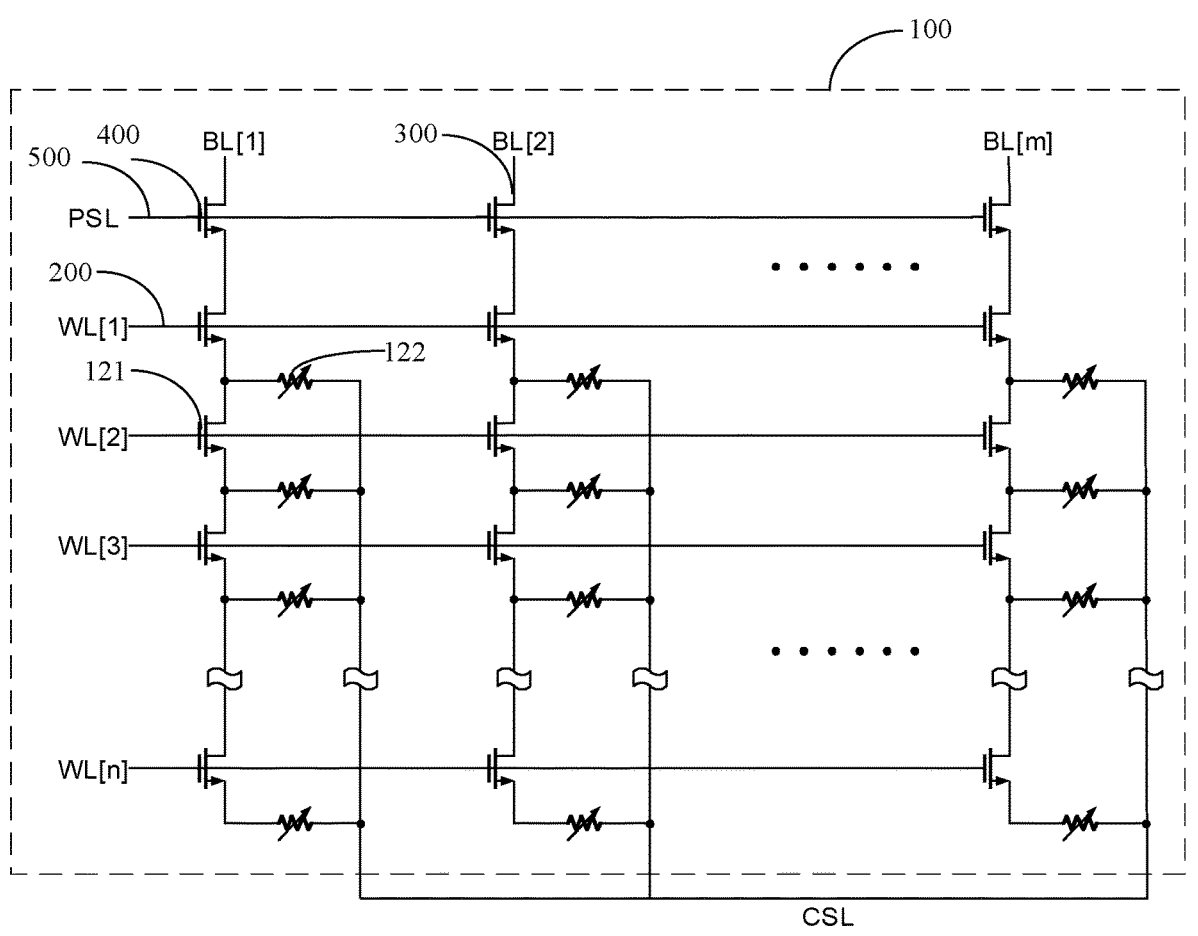
FIG. 4 is a schematic diagram of a memory plane provided by an embodiment of the present application.

FIG. 4 is a schematic diagram of a single memory plane 100. As shown in FIG. 4, a bit line 300 is connected to the drain of a gating transistor 400 of a memory string 110, and the source of the gating transistor 400 is connected to a memristive memory cell 120 in the first row of the memory string 110. With reference to FIG. 1, memristive memory cells 120 in the last rows of the M columns of memory strings 110 are all connected to the common source line 600, and the common source line 600 is connected to a reference potential 12 through a reference resistor 11. The reference resistor 11 may be a field effect transistor which acts as a diode by specific connection, or a current-voltage conversion module based on an op-amp, etc. The reference resistor 11 and the reference potential 12 can be specifically selected according to actual requirements, which are not limited in the present application.

As shown in FIG. 1, the word line 200 is used to receive a word line voltage, and the memristive memory cells 120 which belong to the same rows and correspond to different columns of memory strings 110 receive the same word line voltage. For example, the memristive memory cells 120 in the first rows receive a same word line voltage WL[1], and the memristive memory cells 120 in the N-th rows receive a same word line voltage WL[n].

The bit line 300 is used to receive a bit line voltage, and the gating transistors 400 which are in the same columns and correspond to different memory planes 100 receive the same bit line voltage. As shown in FIG. 1, the memory 10 includes H memory planes 100. The gating transistors 400 which are in the first columns and correspond to different memory planes 100 receive a same bit line voltage BL[1]; the gating transistors 400 in the second columns receive a same bit line voltage BL[2]; the gating transistors 400 in the M-th columns receive a same bit line voltage BL[m].

The source of the gating transistor 400 is connected to the memristive memory cell 120 in the first row, and the gating line 500 is connected to the gate of the gating transistor 400. The gating line 500 is used to receive a gating voltage, and all gating transistors 400 on one memory plane 100 receive the same gating voltage. As shown in FIG. 1, all gating transistors on the first memory plane 100 receive a gating voltage PSL[1]; all gating transistors on the second memory plane 100 receive a gating voltage PSL[2]; and all gating transistors on the H-th memory plane receive a gating voltage PSL[h].

When reading from the memristive memory cell 120 in the k-th row of the j-th memory string 110 on the i-th memory plane 100, that is, when reading from the memristive memory cell 120 to be read, a voltage at a bit line corresponding to the j-th memory string 110 is a bit line active voltage. Except for the j-th memory string 110 and memory strings 110 in same columns as the j-th memory string 110, voltages at bit lines corresponding to the other memory strings 110 are bit line inactive voltages (such as being reference voltages).

All gating transistors 400 on the i-th memory plane 100 are turned on, and all gating transistors 400 on other memory planes 100 except for the i-th memory plane 100 are turned off. Before reading, no current exists in the transistors included in all memristive memory cells in the memory.

While reading, when k=1, the transistor 121 included in the memristive memory cell 120 to be read is turned on, and no current exists in transistors 121 included in the other memristive memory cells 120. When k=1, the memristive memory cell 120 to be read is connected to the gating transistor 400. When k=1, a word line active level may be input at the gate of the transistor 121 included in the memristive memory cell 120 to be read. For example, a level of WL[1] is set as $V_{wl\_1}$, and the transistor 121 of the memristive memory cell to be read is turned on. Word line inactive levels are input at gates of transistors 121 included in the other memristive memory cells 120, and no current exists in the transistors 121 included in the other memristive memory cells 120.

When k=1, only one reading cycle is required. Assuming that a source-drain equivalent resistance value of the transistor 121 included in the memristive memory cell 120 to be read is much smaller than a resistance value of the memristor 122, the transistor 121 that is turned on can be equivalent to a wire, then the memristor 122 is connected in series with the reference resistor 11 to divide the voltage. A voltage at the common source line 600 at this time is recorded as $V_1$.

Then, the resistance value of the memristor 122 is determined according to the formula $$R_1 = \frac{(V_{bl\_read\_active} - V_1)}{(V_1 - V_{ref})} R_{ref}.$$

$R_1$ represents the resistance value of the memristor 122 included in the memristive memory cell 120 to be read. $V_{bl\_read\_active}$ is the bit line active voltage at the bit line 300 corresponding to the j-th memory string 110. $V_1$ is the voltage at the common source line 600 while reading. $R_{ref}$ is a resistance value of the reference resistor 11. $V_{ref}$ represents a potential difference between the reference potential 12 and the ground.

While reading, when k>1, 2 reading cycles are required. During the first reading cycle, transistors included in the memristive memory cells 120 in the first row to the (k−1)-th row of the j-th memory string 110 are all turned on first. During the second reading cycle, transistors in the first row to the k-th row of the j-th memory string 110 are turned on, and no current exists in transistors included in the other memristive memory cells 120. Therein, i, j and k are all integers greater than zero, and i≤H, j≤M, 1<k≤N.

When k>1, the resistance value of the memristor 122 included in the memristive memory cell 120 to be read is determined according to the formula $$R_k = \frac{(V_{bl\_read\_active} - V_k)(V_{bl\_read\_active} - V_{k-1})}{(V_{bl\_read\_active} - V_{ref})(V_k - V_{k-1})} R_{ref}.$$

$R_k$ represents the resistance value of the memristor 122 included in the memristive memory cell 120 to be read. $V_{bl\_read\_active}$ is the bit line active voltage at the bit line 300 corresponding to the j-th memory string 110. $V_{k-1}$ is a voltage at the common source line 600 during the first reading cycle. $V_k$ is a voltage at the common source line 600 during the second reading cycle.

When reading from the memristive memory cells 120 in the first row to the n-th row of the j-th memory string 110 on the i-th memory plane 100, the voltage at the bit line 300 corresponding to the j-th memory string 110 is the bit line active voltage. Except for the j-th memory string 110 and the memory strings 110 in same columns as the j-th memory string 110, voltages at bit lines 300 corresponding to the other memory strings 110 are bit line inactive voltages. Moreover, all gating transistors 400 on the i-th memory plane 100 are turned on, and gating transistors 400 on the other memory planes 100 are all turned off. While reading, transistors included in the memristive memory cells 120 to be read are turned on in sequence. Therein, i, j and n are all integers greater than zero, and i≤H, j≤M, 1<n≤N.

Specifically, before reading, no current exists in transistors 121 included in all memristive memory cells 120 in the memory 10. While reading, during the x-th reading cycle of the j-th memory string 110 on the i-th memory plane 100, transistors 121 included in the memristive memory cells 120 in the first row to the x-th row of the j-th memory string 110 on the i-th memory plane 100 are turned on. Therein, x is an integer, and 1≤x≤n.

During the first reading cycle, a resistance value of the memristive memory cell 120 in the first row of the j-th memory string 110 on the i-th memory plane is read. The level of WL[1] is set to $V_{wl\_1}$, while levels of the other word line voltages WLs remain unchanged. The transistor 121 in the first row of the j-th memory string 110 on the i-th memory plane 100 is turned on, and the other transistors 121 are turned off. Assuming that an on-resistance value of the transistor 121 is much smaller than a resistance value of the memristor 122, the transistor 121 that is turned on can be equivalent to a wire, then the memristor 122 in the first row of the j-th memory string 110 on the i-th memory plane is connected in series with the reference resistor 11 to divide the voltage. If the voltage of the common source line 600 at this time is recorded as $V_1$, then the resistance value of the memristor included in the memristive memory cell to be read is determined according to the formula

7

$$R_1 = \frac{V_{bl\_read\_active} - V_1}{V_1 - V_{ref}} R_{ref}.$$

$R_1$ represents the resistance value of the memristor included in the memristive memory cell to be read in the first row of the j-th memory string 110. $V_{bl\_read\_active}$ is the bit line active voltage at the bit line corresponding to the j-th memory string 110. $V_1$ is the voltage at the common source line 600 during the first reading cycle. $R_{ref}$ is the resistance value of the reference resistor 11. $V_{ref}$ represents the potential difference between the reference potential 12 and the ground.

During the second reading cycle, a resistance value of a memristor 122 in the second row of the j-th memory string 110 on the i-th memory plane 100 is read. Levels of WL[1] and WL[2] are set to $V_{wl\_1}$ and $V_{wl\_2}$, respectively, while levels of the other word line voltages WLs remain unchanged. Transistors 121 in the first row to the second row of the j-th memory string 110 on the i-th memory plane 100 are turned on, and the other transistors 121 are turned off. Then memristors in the first row to the second row of the j-th memory string 110 on the i-th memory plane are connected in parallel and then connected in series with the reference resistor to divide the voltage. If a CSL potential at this time is recorded as $V_2$, then the resistance value of the memristor in the second row of the j-th memory string 110 on the i-th memory plane can be known through $V_1$ and $V_2$. Specifically, the resistance value of the memristor 122 in the second row of the j-th memory string 110 on the i-th memory plane 100 is determined according to the formula $$R_2 = \frac{(V_{bl\_read\_active} - V_2)(V_{bl\_read\_active} - V_1)}{(V_{bl\_read\_active} - V_{ref})(V_2 - V_1)} R_{ref}.$$

$R_2$ represents the resistance value of the memristor 122 included in the memristive memory cell 120 to be read in the second row of the j-th memory string 110. $V_{bl\_read\_active}$ represents the bit line active voltage at the bit line 300 corresponding to the j-th memory string 110. $V_1$ is the voltage at the common source line 600 during the first reading cycle. $V_2$ is the voltage at the common source line 600 during the second reading cycle.

During the x-th reading cycle, a resistance value of a memristor 122 in an x-th row of the j-th memory string 110 on the i-th memory plane 100 is read. Levels of WL[1] to WL[x] are set to $V_{wl\_1}, V_{wl\_2} \ldots, V_{wl\_x}$, respectively, while levels of the other word line voltages WLs remain unchanged. Transistors 121 included in the memristive memory cells 120 in the first row to the x-th row of the j-th memory string 110 on the i-th memory plane 100 are turned on, and transistors 121 included in the memristive memory cells 120 in the other rows are turned off. Then memristors in the first row to the x-th row of the j-th memory string 110 on the i-th memory plane are connected in parallel and connected in series with the reference resistor to divide the voltage. If a CSL potential at this time is recorded as $V_x$, then the resistance value of the memristor in the x-th row of the j-th memory string 110 on the i-th memory plane can be known through $V_{x-1}$ and $V_x$. The resistance value of the memristor included in the memristive memory cell in the x-th row to be read is determined according to the formula $$R_x = \frac{(V_{bl\_read\_active} - V_x)(V_{bl\_read\_active} - V_{x-1})}{(V_{bl\_read\_active} - V_{ref})(V_x - V_{x-1})} R_{ref}.$$

8

$R_x$ represents the resistance value of the memristor included in the memristive memory cell to be read in the x-th row of the j-th memory string 110. $V_{bl\_read\_active}$ is the bit line active voltage at the bit line corresponding to the j-th memory string. $V_{x-1}$ is a voltage at the common source line during the (x−1)-th reading cycle. $V_x$ is a voltage at the common source line during the x-th reading cycle, where $1 < x \leq n$.

By analogy, during the n-th reading cycle, a resistance value of a memristor 122 in the n-th row of the j-th memory string 110 on the i-th memory plane 100 is read. Levels of WL[1] to WL[n] are set to $V_{wl\_1}, V_{wl\_2} \ldots, V_{wl\_n}$, respectively, while levels of the other word line voltages WLs remain unchanged. Transistors 121 included in the memristive memory cells in the first row to the n-th row of the j-th memory string 110 on the i-th memory plane 100 are turned on, and the other transistors 121 are turned off. Then memristors 122 in the first row to the n-th row of the j-th memory string 110 on the i-th memory plane 100 are connected in parallel and then connected in series with the reference resistor 11 to divide the voltage. A level at the common source line 600 at this time is recorded as $V_n$.

The resistance value of the memristor included in the memristive memory cell to be read in the n-th row of the j-th memory string is determined according to the formula $$R_n = \frac{(V_{bl\_read\_active} - V_n)(V_{bl\_read\_active} - V_{n-1})}{(V_{bl\_read\_active} - V_{ref})(V_n - V_{n-1})} R_{ref}.$$

$R_n$ represents the resistance value of the memristor 122 included in the memristive memory cell 120 to be read in the n-th row of the j-th memory string. $V_{bl\_read\_active}$ is the bit line active voltage at the bit line 300 corresponding to the j-th memory string. $V_{n-1}$ is a voltage at the common source line 600 during the (n−1)-th reading cycle. $V_n$ is a voltage at the common source line 600 during the n-th reading cycle.

When writing to the memristive memory cell 120 in the k-th row of the j-th memory string 110 on the i-th memory plane 100 (a memristive memory cell 120 to be written), A target resistance value will be written to a memristive memory cell 120 to be written, and a level difference between the common source line 600 and the bit line 300 corresponding to the j-th memory string 110 is required, where the level difference is determined according to the target resistance value. Each word line 200 corresponding to the first row to the k-th row of the j-th memory string 110 has a word line level. The level difference and the word line level are used to turn on the corresponding transistor 121, and no current exists in the other transistors 121. All gating transistors 400 on the i-th memory plane 100 are turned on, and the other gating transistors 400 are all turned off.

Specifically, resistance values of memristors 122 in the first row to the (k−1)-th row ((k−1) rows in total) of the j-th memory string 110 on the i-th memory plane 100 are read and saved, and are recorded as original resistance values. Then, the voltage at the common source line 600 is set as a reference voltage to avoid power consumption.

A level of the gating voltage PSL[i] of the j-th memory string 110 is set as $V_{psl\_write\_active}$ (a gating line active level), and levels of the other gating voltages PSLs are set as $V_{psl\_write\_inactive}$ (a gating line inactive level), so that all gating transistors 400 on the i-th memory plane 100 are turned on, and the other gating transistors 400 are turned off. Then, the voltage at the bit line 300 corresponding to the j-th memory string 110 is set as a first voltage, and voltages at the other bit lines 300 are set as a reference voltage. The first voltage is determined according to the target resistance value of the memristive memory cell 120 to be written. For example, the first voltage $V_{bl}=(V_{csl\_write}+V_{set})$ or $V_{bl}=(V_{csl\_write}+V_{reset})$. $V_{set}$ and $V_{reset}$ are set according to the target resistance value, and $V_{csl\_write}$ is a voltage at the common source line 600.

Within the first programming cycle, the voltage at the bit line 300 corresponding to the j-th memory string 110 is the first voltage, and voltages at the other bit lines 300 are the reference voltage. Levels of WL[1] to WL[k] are respectively set as their respective bit line active levels, and levels of the other word line voltages WLs are respectively set as their respective bit line inactive levels. Thus, the transistors 121 included in the memristive memory cell in the first row to the k-th row of the j-th memory string 110 on the i-th memory plane 100 are turned on, then k number of memristors 122 are in a parallel state, where a voltage across each memristor 122 is $V_{set}$ or $V_{reset}$. After a period of time, resistance values of the k number of memristors 122 are uniformly set as the target resistance value, and the writing of the memory cell 120 to be written is completed.

Within the second programming cycle, according to the original resistance value of the memristor 122 in the (k−1)-th row of the j-th memory string 110 on the i-th memory plane 100, a level of BL[j] is set as $V_{bl\_write\_active}$, where $V_{bl\_write\_active}=(V_{csl\_write}+V_{set})$ or $(V_{csl\_write}+V_{set})$, and levels of the other bit line voltages BLs remain unchanged. Then, the levels of WL[1] to WL[k−1] are respectively set as their respective bit line active levels, and the levels of the other word line voltages WLs are respectively set as their respective bit line inactive levels. Then, transistors 121 in the first row to the (k−1)-th row of the j-th memory string 110 on the i-th memory plane 100 are turned on, and the other transistors 121 included in the memristive memory cells are turned off. Thus, (k−1) number of memristors 122 in the first row to the (k−1)-th row of the j-th memory string 110 on the i-th memory plane 100 are connected in parallel, and a voltage across each memristor 122 is $V_{set}$ or $V_{reset}$. After a period of time, the resistance values of the (k−1) number of memristors 122 are uniformly programmed as the original resistance value of the memristor 122 in the (k−1)-th row of the j-th memory string 110 on the i-th memory plane 100. At this time, resistance value regeneration of the memristor 122 in the (k−1)-th row is completed.

By analogy, within the k-th programming cycle, according to the original resistance value of the memristor 122 in the first row of the j-th memory string 110 on the i-th memory plane 100, a level of BL[j] is set as $V_{bl\_write\_active}$, where $V_{bl\_write\_active}=(V_{csl\_write}+V_{set})$ or $(V_{csl\_write}+V_{reset})$, and levels of the other bit line voltages BLs remain unchanged. The level of WL[1] is set as the bit line active level, and levels of the other word line WLs are respectively set as their respective bit line inactive levels. The transistor 121 in the first row of the j-th memory string 110 on the i-th memory plane 100 is turned on, and the other transistors 121 are turned off. A voltage across the memristor 122 in the first row of the j-th memory string 110 on the i-th memory plane 100 is $V_{set}$ or $V_{reset}$. After a period of time, the resistance value of the memristor 122 in the first row is programmed as the original resistance value of the memristor 122 in the first row of the j-th memory string 110 on the i-th memory plane 100. At this time, resistance value regeneration of the memristor 122 in the first row is completed.

When erasing the j-th memory string 110 (a memory string 110 to be erased) on the i-th memory plane 100, the voltage at the bit line 300 corresponding to the memory string 110 to be erased is a bit line active voltage, and voltages at the other bit lines are bit line inactive voltages. All gating transistors 400 on the i-th memory plane 100 are turned on, and the other gating transistors 400 are turned off. All transistors 121 included in the memristive memory cells of the j-th memory string 110 are turned on.

Specifically, to erase the j-th memory string 110 on the i-th memory plane, a voltage of the common source line 600 is set to $V_{csl\_erase}$ (for example, the reference voltage $V_{ref}$ may be taken as $V_{csl\_erase}$). A voltage between BL[j] and the common source line 600 is set as a memristor reset voltage $V_{reset}$, that is, the level of BL[j] is a bit line active level $V_{bl\_erase\_active}$, where $V_{bl\_erase\_active}=V_{csl\_erase}+V_{reset}$. Levels of the other bit line voltages BLs are set as a bit line inactive level $V_{bl\_erase\_inactive}$ (for example, $V_{csl\_erase}$ may be taken as the bit line inactive level). Then a level of PSL[i] is set as the gating line active level, and levels of the other gating voltages PSLs are set as the gating line inactive level, so that all gating transistors 400 on the i-th memory plane are turned on, and the other gating transistors 400 are turned off. Finally, the levels of word line voltages WLs corresponding to the memory string 110 to be erased are respectively set to the corresponding bit line active levels, so that all transistors 121 included in the memristive memory cells of the memory string 110 to be erased are turned on.

Assuming that in the memory string 110 to be erased, an on-resistance value of each transistor 121 is much smaller than a resistance value of its corresponding memristor 122, the transistor 121 that is turned on can be equivalent to a wire. Then all memristors 122 of the j-th memory string 110 on the i-th memory plane are connected in parallel, and the memristor reset voltage $V_{reset}$ is applied to both ends of each memristor 122. After a period of time, all memristors 122 included in the memristive memory cells of the memory string 110 to be erased can be erased at the same time.

The memory 10 provided by this embodiment has a three-dimensional structure.

Referring to FIG. 5, an embodiment of the present application also provides a memory reading method, which is applied to the memory 10 as described above. When a memristive memory cell 120 to be read is located in the k-th row of the j-th memory string on the i-th memory plane, the method includes the following steps.

S510, inputting the bit line active voltage at the bit line corresponding to the j-th memory string 110.

S520, except for the j-th memory string and the memory strings in the same columns as the j-th memory string, inputting the bit line inactive voltages at the bit lines corresponding to the other memory strings.

S530, turning on all gating transistors on the i-th memory plane 100, and turning off the other gating transistors 400.

S540, before reading, making no current exist in transistors included in all memristive memory cells in the memory.

S550, after reading, when k=1, turning on the transistor included in the memristive memory cell to be read.

S560, when k>1, during the first reading cycle, turning on transistors included in the memristive memory cells in the first row to the (k−1)-th row; and during the second reading cycle, turning on transistors included in the memristive memory cells in the first row to the k-th row; where i, j and k are all integers greater than zero, and i≤H, j≤M and k≤N.

With respect to the reading method of the memristive memory cell, reference can be made to the above descriptions of steps S510 to S560.

Referring to FIG. 6, an embodiment of the present application also provides a memory reading method, which is applied to the memory 10 as described above. When memristive memory cells to be read are located in the first row to the n-th row of the j-th memory string on the i-th memory plane, the method includes the following steps.

S610, inputting the bit line active voltage at the bit line corresponding to the j-th memory string: inputting the bit line inactive voltages at the other bit lines.

S620, turning on all gating transistors on the i-th memory plane 100, and turning off the other gating transistors 400.

S630, before reading, making no current exist in transistors included in all memristive memory cells in the memory.

S640, after starting reading, during the x-th reading cycle, turning on transistors included in the memristive memory cells in the first row to the x-th row of the j-th memory string on the i-th memory plane, where a total of n number of reading cycles are required; where i, j, n and x are all integers greater than zero, and i≤H, j<M, 1<n<N, 1≤x≤n.

Referring to FIG. 7, an embodiment of the present application also provides a memory writing method, which is applied to the memory 10 as described above. When a memristive memory cell to be written is located in the k-th row of the j-th memory string on the i-th memory plane, resistance values of the memristors 122 in the first row to the (k−1)-th row ((k−1) rows in total) of the j-th memory string 110 on the i-th memory plane 100 are first read and saved (as shown in FIG. 5), and are recorded as original resistance values. Then the voltage at the common source line 600 is set as the reference voltage, and the target resistance value of the memristive memory cell to be written is written. The method includes the following steps.

S710, setting a level difference between the common source line and the bit line corresponding to the j-th memory string, where each word line corresponding to the first row to the k-th row of the j-th memory string has a word line level, and the level difference and the word line levels are used to turn on transistors included in the memristive memory cells in the first row to the k-th row.

S720, turning on all gating transistors on the i-th memory plane 100, and turning off the other gating transistors 400.

S730, except for the memristive memory cells in the first row to the k-th row, making no current exist in the other transistors.

At the same time as writing to the memristive memory cell to be written, the memristive memory cells in the first row to the (k−1)-th row of the j-th memory string on the i-th memory plane are also written to. Each memristive memory cell has the target resistance value of the k-th row after being written to. After the writing is completed, by taking original resistance values corresponding to the memristive memory cells in the (k−1)-th row to the first row of the j-th memory string on the i-th memory plane as corresponding target resistance values, the memristive memory cells in the (k−1)-th row to the first row of the j-th memory string on the i-th memory plane are rewritten to in sequence.

Figure 8:
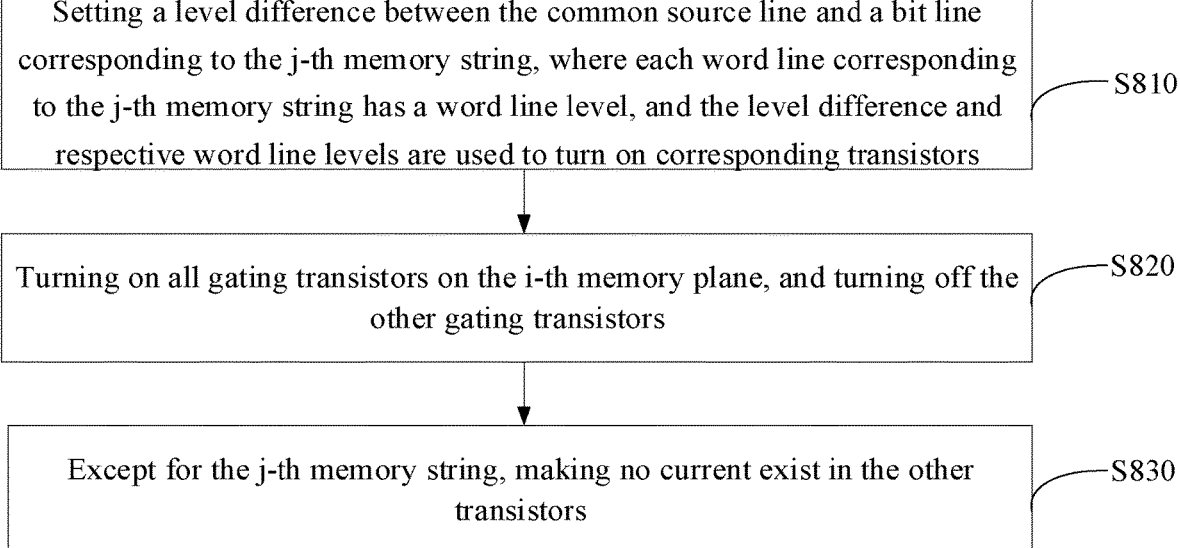
FIG. 8 illustrates a memory erasing method provided by an embodiment of the present application.

Referring to FIG. 8, an embodiment of the present application also provides a memory erasing method, which is applied to the memory 10 as described above. When a memory string to be erased is the j-th memory string on the i-th memory plane, the method includes the following steps.

S810, setting a level difference between the common source line and the bit line corresponding to the j-th memory string, where each word line corresponding to the j-th memory string has a word line level, and the level difference and the respective word line levels are used to turn on corresponding transistors.

S820, turning on all gating transistors on the i-th memory plane 100, and turning off the other gating transistors 400.

S830, except for the j-th memory string, making no current exist in the other transistors.

The above are only preferred embodiments of the present application, which do not limit the patent scope of the present application. Any equivalent structure or equivalent process transformation made by using the description and the drawings of the present application, or direct or indirect utilization in other related technical fields, is equally included in the patent protection scope of the present application.

What is claimed is:

1. A memory, comprising:

H memory planes arranged in parallel along a first direction, wherein each memory plane extends in a second direction, and the memory plane comprises M columns of memory strings; the memory strings extend in a third direction; the first direction, the second direction and the third direction are different; and H and M are integers greater than zero;

wherein a single column of memory string comprises:

N rows of memristive memory cells connected in sequence, wherein N is an integer greater than zero;

N word lines, wherein a single word line is connected to corresponding rows of memristive memory cells; the word lines are used to receive word line voltages; and memristive memory cells in same rows receive a same word line voltage;

gating transistors, wherein sources of the gating transistors are connected to memristive memory cells in first rows;

gating lines, connected to gates of the gating transistors for receiving gating voltages, wherein all gating transistors on a memory plane receive a same gating voltage;

bit lines, connected to drains of the gating transistors for receiving bit line voltages, wherein gating transistors in same columns on different memory planes receive a same bit line voltage;

a common source line, wherein memristive memory cells in last rows of all memory strings are connected to the common source line, and the common source line is connected to a reference potential through a reference resistor.

2. The memory according to claim 1, wherein each memristive memory cell comprises a transistor and a memristor; a first end of the memristor is connected to a source of the transistor, and a second end of the memristor is connected to second ends of all memristors of a same memory string; the source of the transistor is connected to a drain of an adjacent transistor of the same memory string, and a source of a transistor in a last row of the memory string is connected to the common source line;

a word line is connected to a gate of the transistor.

3. The memory according to claim 2, wherein when a memristive memory cell to be read is located in a k-th row of a j-th memory string on an i-th memory plane, a voltage at a bit line corresponding to the j-th memory string is a bit line active voltage; voltages at other bit lines are bit line inactive voltages;

all gating transistors on the i-th memory plane is turned on, and other gating transistors are turned off;

when k=1, a transistor comprised in the memristive memory cell to be read is turned on, and no current exists in other transistors; the memristive memory cell to be read is connected to a gating transistor;

when k>1, during a first reading cycle, transistors comprised in memristive memory cells in a first row to a (k−1)-th row of the j-th memory string are all turned on first; and during a second reading cycle, transistors in the first row to the k-th row of the j-th memory string are turned on, and no current exists in other transistors; wherein i, j and k are all integers greater than zero, and i≤H, j≤M, k≤N.

4. The memory according to claim 2, wherein when memristive memory cells to be read are located in a first row to an n-th row of a j-th memory string on an i-th memory plane, a voltage at a bit line corresponding to the j-th memory string is a bit line active voltage; voltages at other bit lines are bit line inactive voltages;

all gating transistors on the i-th memory plane are turned on, and other gating transistors are turned off;

transistors comprised in the memristive memory cells to be read are turned in sequence;

wherein i, j and n are all integers greater than zero, and i≤H, j≤M, 1<n≤N.

5. The memory according to claim 2, wherein when k>1, a target resistance value is to be written to a memristive memory cell to be written; and when the memristive memory cell to be written is located in a k-th row of a j-th memory string on an i-th memory plane, original resistance values corresponding to memristive memory cells in a first row to a (k−1)-th row of the j-th memory string on the i-th memory plane are read and saved; a level difference is determined according to the target resistance value; the level difference is set between the common source line and a bit line corresponding to the j-th memory string; each word line corresponding to the first row to the k-th row of the j-th memory string has a word line level, wherein the level difference and word line levels are used to turn on transistors comprised in the memristive memory cells in the first row to the k-th row;

except for the memristive memory cells in the first row to the k-th row, no current exists in other transistors;

all gating transistors on the i-th memory plane are turned on, and other gating transistors are turned off; at the same time as writing to the memristive memory cell to be written, the memristive memory cells in the first row to the (k−1)-th row of the j-th memory string on the i-th memory plane are also written to, wherein each memristive memory cell has the target resistance value of the k-th row after being written to; by taking the original resistance values corresponding to the memristive memory cells in the (k−1)-th row to the first row of the j-th memory string on the i-th memory plane as corresponding target resistance values, the memristive memory cells in the (k−1)-th row to the first row of the j-th memory string on the i-th memory plane are rewritten to in sequence;

wherein i, j and k are all integers greater than zero, and i≤H, j≤M, k≤N.

6. The memory according to claim 2, wherein when a memory string to be erased is a j-th memory string on an i-th memory plane, there is a level difference between the common source line and a bit line corresponding to the j-th memory string; each word line corresponding to the j-th memory string has a word line level, wherein the level difference and word line levels are used to turn on each of transistors of the j-th memory string;

all gating transistors on the i-th memory plane are turned on, and other gating transistors are turned off;

and, except for the j-th memory string on the i-th memory plane, no current exists in other transistors;

wherein i and j are all integers greater than zero, and i≤H, j≤M.

7. A memory reading method, applied to the memory according to claim 1, wherein when a memristive memory cell to be read is located in a k-th row of a j-th memory string on an i-th memory plane, the method comprises:

inputting a bit line active voltage at a bit line corresponding to the j-th memory string;

except for the j-th memory string and memory strings in same columns as the j-th memory string, inputting bit line inactive voltages at bit lines corresponding to other memory strings;

turning on all gating transistors on the i-th memory plane, and turning off other gating transistors;

before reading, making no current exist in transistors comprised in all memristive memory cells comprised in the memory;

after starting reading, when k=1, turning on a transistor comprised in the memristive memory cell to be read;

when k>1, during a first reading cycle, turning on transistors comprised in memristive memory cells in a first row to a (k−1)-th row of the j-th memory string on the i-th memory plane; and during a second reading cycle, turning on transistors comprised in memristive memory cells in the first row to the k-th row of the j-th memory string on the i-th memory plane;

wherein i, j and k are all integers greater than zero, and i≤H, j≤M and k≤N.

8. The memory reading method according to claim 7, wherein when k=1, a resistance value of a memristor included in the memristive memory cell to be read is determined according to a formula $$R_1 = \frac{V_{bl\_read\_active} - V_1}{V_1 - V_{ref}} R_{ref},$$

wherein $R_1$ represents the resistance value of the memristor comprised in the memristive memory cell to be read, $V_{bl\_read\_active}$ is the bit line active voltage at the bit line corresponding to the j-th memory string, V1 is a voltage at the common source line when reading from the memristive memory cell to be read, Rref is a resistance value of the reference resistor, and Vref represents a potential difference between the reference potential and ground;

when k>1, the resistance value of the memristor comprised in the memristive memory cell to be read is determined according to a formula $$R_k = \frac{(V_{bl\_read\_active} - V_k)(V_{bl\_read\_active} - V_{k-1})}{(V_{bl\_read\_active} - V_{ref})(V_k - V_{k-1})} R_{ref},$$

wherein $R_k$ represents the resistance value of the memristor comprised in the memristive memory cell to be read, $V_{bl\_read\_active}$ is the bit line active voltage at the bit line corresponding to the j-th memory string, $V_{k-1}$ is a voltage at the common source line during the first reading cycle, and $V_k$ is a voltage at the common source line during the second reading cycle.

9. A memory reading method, applied to the memory according to claim 1, wherein when memristive memory cells to be read are located in a first row to an n-th row of a j-th memory string on an i-th memory plane, the method comprises:

inputting a bit line active voltage at a bit line corresponding to the j th memory string; inputting bit line inactive voltages at other bit lines;

turning on all gating transistors on the i-th memory plane, and turning off other gating transistors;

before reading, making no current exist in transistors comprised in all memristive memory cells in the memory;

after starting reading, during an x-th reading cycle, turning on transistors comprised in memristive memory cells in the first row to an x-th row of the j-th memory string on the i-th memory plane, wherein a total of n reading cycles are required;

wherein i, j, n and x are all integers greater than zero, and i≤H, j≤M, 1<n≤N, 1≤x≤n.

10. The memory reading method according to claim 9, wherein a resistance value of a memristor in the first row comprised in the memristive memory cells to be read is determined according to a formula $$R_1 = \frac{V_{bl\_read\_active} - V_1}{V_1 - V_{ref}} R_{ref};$$

wherein $R_1$ represents the resistance value of the memristor in the first row comprised in the memristive memory cells to be read, $V_{bl\_read\_active}$ is the bit line active voltage at the bit line corresponding to the j-th memory string, $V_1$ is a voltage at the common source line during a first reading cycle, $R_{ref}$ is a resistance value of the reference resistor, and $V_{ref}$ represents a potential difference between the reference potential and ground;

a resistance value of a memristor in the x-th row comprised in the memristive memory cells to be read is determined according to a formula $$R_x = \frac{(V_{bl\_read\_active} - V_x)(V_{bl\_read\_active} - V_{x-1})}{(V_{bl\_read\_active} - V_{ref})(V_x - V_{x-1})} R_{ref},$$

wherein $R_x$ represents the resistance value of the memristor comprised in the memristive memory cell in the x-th row comprised in the memristive memory cells to be read, $V_{bl\_read\_active}$ is the bit line active voltage at the bit line corresponding to the j-th memory string, $V_{x-1}$ is a voltage at the common source line during an (x−1)-th reading cycle, and $V_x$ is a voltage at the common source line during the x-th reading cycle.

11. A memory writing method, applied to the memory according to claim 1, wherein a target resistance value is to be written to a memristive memory cell to be written, and when a memristive memory cell to be written is located in a k-th row of a j-th memory string on an i-th memory plane, the method comprises:

determining a level difference according to the target resistance value, and setting the level difference between the common source line and a bit line corresponding to the j-th memory string, wherein each word line corresponding to a first row to the k-th row of the j-th memory string has a word line level, and the level difference and word line levels are used to turn on transistors comprised in memristive memory cells in the first row to the k-th row;

turning on all gating transistors on the i-th memory plane, and turning off other gating transistors;

wherein except for the memristive memory cells in the first row to the k-th row, no current exists in other transistors;

wherein i, j and k are all integers greater than zero, and i≤H, j≤M, k≤N.

12. The memory writing method according to claim 11, further comprising:

when k>1, determining the level difference according to the target resistance value, and before setting the level difference between the common source line and the bit line corresponding to the j-th memory string, reading and saving original resistance values of memristive memory cells in the first row to a (k−1)-th row of the j-th memory string on the i-th memory plane;

wherein i, j, k and x are all integers greater than zero, and i≤H, j≤M, 1<k≤N, 1≤x≤k−1.

13. The memory writing method according to claim 12, wherein at the same time as writing to the memristive memory cells to be written, the memristive memory cells in the first row to the (k−1)-th row of the j-th memory string on the i-th memory plane are also written to, and the target resistance value of the k-th row is to be written to each memristive memory cell.

14. A memory erasing method, applied to the memory according to claim 1, wherein when a memory string to be erased is a j-th memory string corresponding to an i-th memory plane, the method comprises:

setting a level difference between the common source line and a bit line corresponding to the j-th memory string, wherein each word line corresponding to the j-th memory string has a word line level, and the level difference and word line levels are used to turn on each transistor corresponding to the j-th memory string;

turning on all gating transistors corresponding to the i-th memory plane; and turning off other gating transistors;

wherein except for the j-th memory string, no current exists in other transistors.

15. The memory writing method according to claim 12, wherein reading and saving the original resistance values of the memristive memory cells in the first row to the (k−1)-th row of the j-th memory string on the i-th memory plane comprises:

inputting a bit line active voltage at the bit line corresponding to the j-th memory string; inputting bit line inactive voltages at others bit lines;

turning on all gating transistors on the i-th memory plane, and turning off other gating transistors;

before reading, making no current exist in transistors comprised in all memristive memory cells in the memory;

after starting reading, during an x-th reading cycle, turning on transistors comprised in memristive memory cells in the first row to an x-th row of the j-th memory string on the i-th memory plane;

wherein i, j, k and x are all integers greater than zero, and i≤H, j≤M, 1<k≤N, 1≤x≤k−1.

16. The memory writing method according to claim 12, wherein after turning on all gating transistors on the i-th memory plane and turning off the other gating transistors, the method further comprises: by taking the original resistance values corresponding to the memristive memory cells in the (k−1)-th row to the first row of the j-th memory string on the i-th memory plane as corresponding target resistance values, rewriting to the memristive memory cells in the (k−1)-th row to the first row of the j-th memory string on the i-th memory plane in sequence.

17. The memory writing method according to claim 16, wherein steps of rewriting to the memristive memory cells in the (k−1)-th row to the first row of the j-th memory string on the i-th memory plane in sequence are identical with steps of writing to the memristive memory cell to be written in the k-th row of a j-th memory string on the i-th memory plane.

* * * * *